(12) United States Patent
Jiang et al.

(10) Patent No.: US 11,471,377 B2
(45) Date of Patent: Oct. 18, 2022

(54) SWITCHABLE VIBRATION MODAL ULTRASONIC DEVICE AND METHOD BASED ON SAME

(71) Applicant: JIANGSU UNIVERSITY, Zhenjiang (CN)

(72) Inventors: Wenfan Jiang, Zhenjiang (CN); Yinfang Jiang, Zhenjiang (CN); Bo Wu, Zhenjiang (CN); Zhengqian Dong, Zhenjiang (CN); Wei Jin, Zhenjiang (CN)

(73) Assignee: JIANGSU UNIVERSITY, Zhenjiang (CN)

( * ) Notice: Subject to any disclaimer, the term of this patent is extended or adjusted under 35 U.S.C. 154(b) by 0 days.

(21) Appl. No.: 17/434,459

(22) PCT Filed: Jul. 23, 2020

(86) PCT No.: PCT/CN2020/103660
§ 371 (c)(1),
(2) Date: Aug. 27, 2021

(87) PCT Pub. No.: WO2022/006997
PCT Pub. Date: Jan. 13, 2022

(65) Prior Publication Data
US 2022/0096322 A1    Mar. 31, 2022

(30) Foreign Application Priority Data

Jul. 9, 2020   (CN) .......................... 202010658016.7

(51) Int. Cl.
A61H 39/00   (2006.01)
B06B 1/04    (2006.01)
(Continued)

(52) U.S. Cl.
CPC .......... A61H 39/007 (2013.01); A61H 39/08 (2013.01); A61H 39/086 (2013.01); B06B 1/045 (2013.01);
(Continued)

(58) Field of Classification Search
CPC .......... B06B 1/045; B06B 3/00; H02K 33/00; H02K 35/00; H02K 35/02; H02K 33/02;
(Continued)

(56) References Cited

U.S. PATENT DOCUMENTS

2019/0321258 A1   10/2019   Malik

FOREIGN PATENT DOCUMENTS

CN    104502443 A    4/2015
CN    106733571 A    5/2017
(Continued)

*Primary Examiner* — Tulsidas C Patel
*Assistant Examiner* — Robert E Mates
(74) *Attorney, Agent, or Firm* — Bayramoglu Law Offices LLC

(57) ABSTRACT

A device and a method for switchable vibration modal ultrasonic are provided. The device includes a hollow shaft, an ultrasonic motor, a limit shell, an electromagnet, a moving tool head, a vibration source and a tool head. The structure design of the ultrasonic motor, the magnetostrictive materials and the drive coil combination of different functions are configured so that, without changing the condition of components, the ultrasonic can switch mode, namely the longitudinal vibration, torsional vibration, and longitudinal and torsional vibration in three different vibration modes. During the operation of the device, different vibration modes are excited without changing the parts, which meets the machining requirements of different vibration forms. Meanwhile, the operation is more convenient and faster, and the overall design structure of the device ensures the efficient and safe operation of the device.

18 Claims, 8 Drawing Sheets

(51) Int. Cl.
 *B06B 3/00* (2006.01)
 *H02K 33/00* (2006.01)
 *H02N 2/00* (2006.01)
 *A61H 39/08* (2006.01)

(52) U.S. Cl.
 CPC ............. *B06B 3/00* (2013.01); *H02K 33/00* (2013.01); *H02N 2/005* (2013.01); *B06B 2201/53* (2013.01); *B06B 2201/76* (2013.01); *H02N 2/00* (2013.01)

(58) Field of Classification Search
 CPC ........ H02K 33/04; H02K 33/06; H02K 33/08; H02K 33/10; H02K 33/12; H02K 33/14; H02N 2/005
 See application file for complete search history.

(56) References Cited

FOREIGN PATENT DOCUMENTS

| | | |
|---|---|---|
| CN | 109363929 A | 2/2019 |
| CN | 109589506 A | 4/2019 |
| CN | 106733571 B | 12/2019 |

SWITCHABLE VIBRATION MODAL ULTRASONIC DEVICE AND METHOD BASED ON SAME

CROSS REFERENCE TO THE RELATED APPLICATIONS

This application is the national phase entry of International Application No. PCT/CN2020/103660, filed on Jul. 23, 2020, which is based upon and claims priority to Chinese Patent Application No. 202010658016.7, filed on Jul. 9, 2020, the entire contents of which are incorporated herein by reference.

TECHNICAL FIELD

The present invention relates to the field of ultrasonic technology, and in particular to an ultrasonic device and method which can switch vibration modes.

BACKGROUND

The invention patent with the publication number CN 104502443A provides a circular array magnetostrictive sensor based on the orthogonal surround coil, which can only produce ultrasonic waves in the form of fixed vibration, namely torsional vibration, which cannot meet the requirements of switching multiple vibration states without changing the components, let alone the motion control of the tool head.

The invention patent with the publication number CN106733571B discloses a single excited longitudinal bending compound vibration ultrasonic transducer. The ultrasonic wave produced by it is compound vibration ultrasonic, but its vibration mode cannot be independently switched, nor can the tool head complete the motion.

The invention patent with the publication number CN109589506A discloses an ultrasonic acupuncture transducer that can switch vibration modes. Although the ultrasonic modal switch can be completed, the transducer cannot control the motion of the tool head.

SUMMARY

To solve the above problems, the present invention provides a device and a method for switchable vibration modal ultrasonic: the structure design of the ultrasonic motor, the magnetostrictive materials and the drive coil combination of different functions are configured so that, without changing the condition of components, the ultrasonic can switch three different vibration modes, namely the longitudinal vibration, torsional vibration, and longitudinal and torsional vibration. During the operation of the device, different vibration modes are excited without changing the parts, which meets the machining requirements of different vibration forms. Meanwhile, the operation is more convenient and faster, and the overall design structure of the device ensures the efficient and safe operation of the device.

The present invention realizes the above-mentioned technical purpose by the following technical means:

A switchable vibration modal ultrasonic device, characterized in that: there is a hollow shaft, ultrasonic motor and limiting shell; the ultrasonic motor comprises an ultrasonic motor shell and an ultrasonic motor rotor; interference fit between the shell of hollow shaft and the ultrasonic motor rotor, the limiting shell is welded to the ultrasonic motor shell, and the limiting shell is arranged on the outside of the shell; the limiting shell and the ultrasonic motor shell are provided with a strip spring threaded slider and a moving tool head of strip spring thread; the strip spring thread slider and the moving tool head are arranged in front and behind opposite positions; the electromagnet is mounted on the inner wall of the shell. When the electromagnet is energized, thread on strip spring thread slider is connected to the casing thread on shell. At the same time, the strip spring threaded slider can slide along the inner side wall of the limiting shell in an axial direction. Strip spring threaded slider push the moving tool head along the outer wall of the shell, the moving tool head is provided with a tool head.

Further, the hollow shaft comprises a shell, and a casing thread is arranged on the outer wall of the shell, an interlayer is arranged on the inner wall of the shell, and an insulating ring is arranged inside the interlayer; the end of the hollow shaft is a solid structure, and a reserved groove is arranged on the solid structure, and a groove is arranged inside the reserved groove.

Further, the moving tool head is provided with an internal vibration source, the vibration source is fixed with a pie spring clasp; the reserved groove is provided with a pie electromagnet; when the pie electromagnet is energized, under the action of magnetic force, the pie spring buckle is fitted with the pie electromagnet. Thus, the vibration source and the moving tool head and the tool head are rotated.

Further, the moving tool head comprises a permanent magnet, a tool head groove and a plane bearing; the moving tool head is a cylindrical shape, and one end of the cylindrical shape is successively arranged with a plane bearing and a permanent magnet. The bottom of the cylinder is provided with a tool head groove, tool head groove is provided with tool head.

Further, the vibration source comprises a vibration coil, a bias magnet, a torsional vibration coil, a conductive filler and a vibration source housing; the vibration source shell is successively arranged with a vibration coil, a paranoid magnet, a torsional vibration coil and a conductive filler.

Further, the vibration source is centered through a tool head groove.

Further, the pie spring buckle comprises a pie base, a transmission plate and a buckle spring. The pie spring base is provided with a groove, in which one end of the buckle spring is arranged, and the other end of the buckle spring is arranged on the transmission plate.

Further, the slider of the strip spring thread comprises a thread, a spring, a slider and a transmission block; the transmission block is provided with thread. Transmission block and thread are provided with grooves in the vertical direction, one end of a spring mounted in the groove, the other end of the spring is provided with a slider; the slider is a T-shaped slider.

Further, the limiting shell is provided with a T-type chute along the axial direction, and the T-type chute is sliding connected with the sliding.

The detection method of a switchable vibration modal ultrasonic device includes the following modes:

Linear motion form: when the electromagnet is energized, the attraction generated by the electromagnet will attract the transmission block, the thread on the transmission block is connected to the thread on the outer shell of the hollow shaft, the slider moves in a straight line in the limiting chute; at the same time, under the action of a permanent magnet, the transmission block is always in contact with the plane bearing, that is, the tool head is always connected with the transmission block, the transmission block pushes and pulls the moving tool head so that the moving tool head moves in a straight line between the inner wall of the limiting shell and the outer wall of the hollow shaft; changing the rotation direction of the ultrasonic motor can change the linear motion direction of the moving tool head, that is, forward and backward;

Rotational motion: when the pie electromagnet is not energized, the transmission plate of the pie spring buckle is kept away from the groove of the hollow shaft under the pull of the buckle spring, the attraction generated by the pie electromagnet after electrification will attract the transmission plate into the groove at the bottom of the hollow shaft, the moving tool head rotate along the hollow shaft; changing the rotation direction of the ultrasonic motor can change the rotation direction of the moving tool head, namely the homeopathic needle rotation and counterclockwise rotation;

Vibration form of ultrasonic source: the direction of the bias magnet in the vibration source is along the axial direction of the tool head, when only the longitudinal vibration coil is supplied with alternating current, the direction of the alternating magnetic field generated by the longitudinal vibration coil is parallel to the axial direction of the tool head; an alternating magnetic field interacts with a bias magnet, causes longitudinal vibration of tool head; when only the torsional vibration coil is fed into the AC current, the direction of alternating magnetic field generated by torsional vibration coil is the circumferential direction of tool head, an alternating magnetic field interacts with a bias magnet, causes torsional vibration of tool head; when the torsional vibration coil and the longitudinal vibration coil are simultaneously connected to the AC current, the tool head is configured to produce a longitudinally torsional vibration mode.

BENEFICIAL EFFECTS

1. This device is designed to help reduce the processing cost and improve the processing efficiency due to the use of a variety of different transducers in the processing process.

2. Based on the traditional single vibration, the ultrasonic vibration of various vibration forms is increased in this device, which makes the machining mode diversified and facilitates the process design and optimization.

3. The device is compact in structure, small in size, convenient to use, limited bit, heat insulation and other safety measures, can work safely and efficiently.

4. The device is composed of the ultrasonic motor and the permanent magnet on the tool head as well as the different driving coils in the vibration source with different functions, so that the device can generate the ultrasonic wave with switchable modes, i.e., longitudinal vibration, torsional vibration and longitudinal torsional vibration, without changing the components.

During the operation of the device, different vibration modes are excited without changing the parts, which meets the machining requirements of different vibration forms. Meanwhile, the operation is more convenient and faster, and the overall design structure of the device ensures the efficient and safe operation of the device.

REFERENCE NUMERAL

Figure 1:
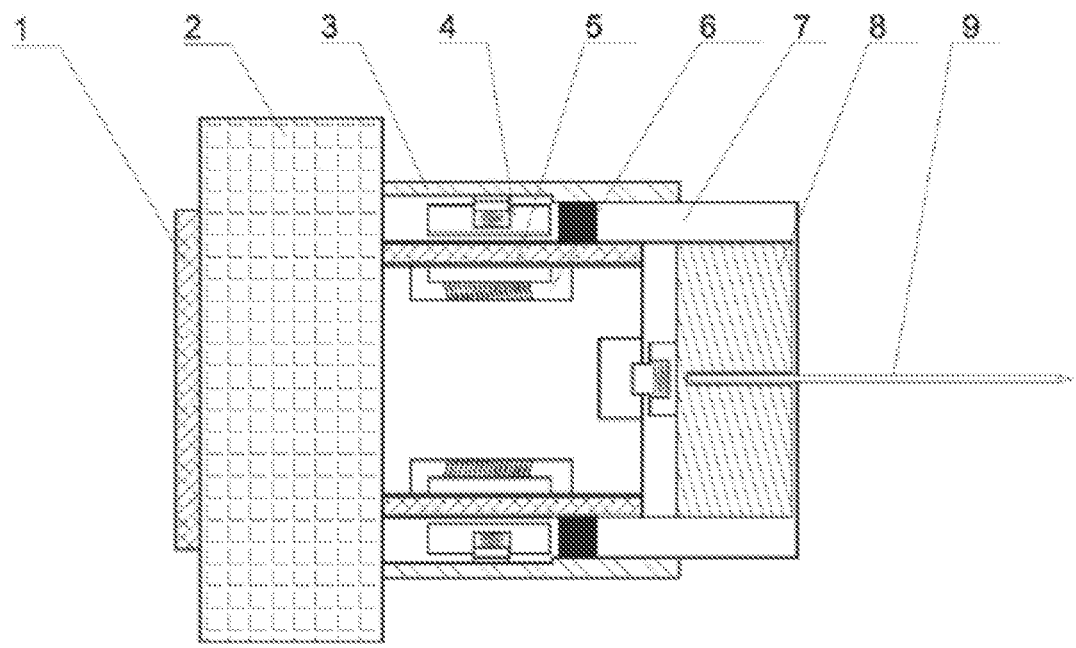
FIG. 1: Schematic diagram of the present invention relates to an ultrasonic method with switchable vibration modes and the overall structure of the device.
Figure 2:
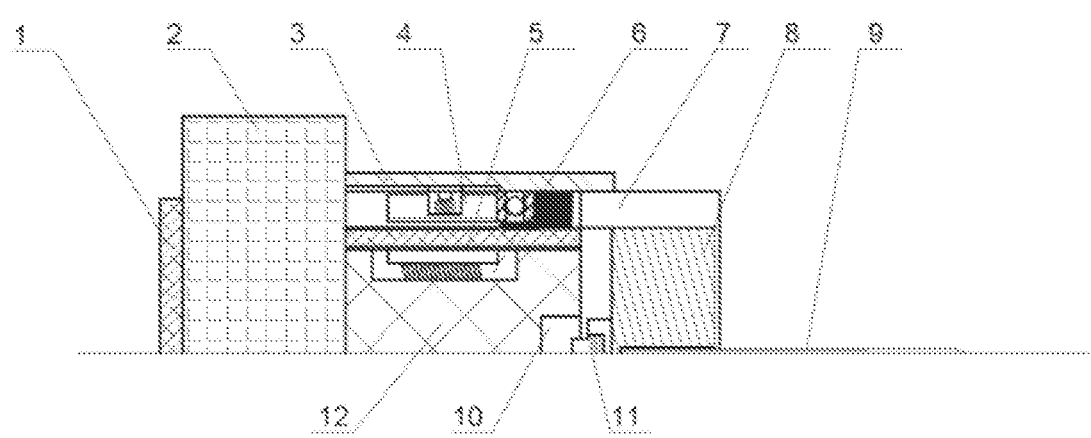
FIG. 2: Half-cutaway view of the present invention relates to an ultrasonic method with switchable vibration modes and the overall structure of the device.
Figure 3:
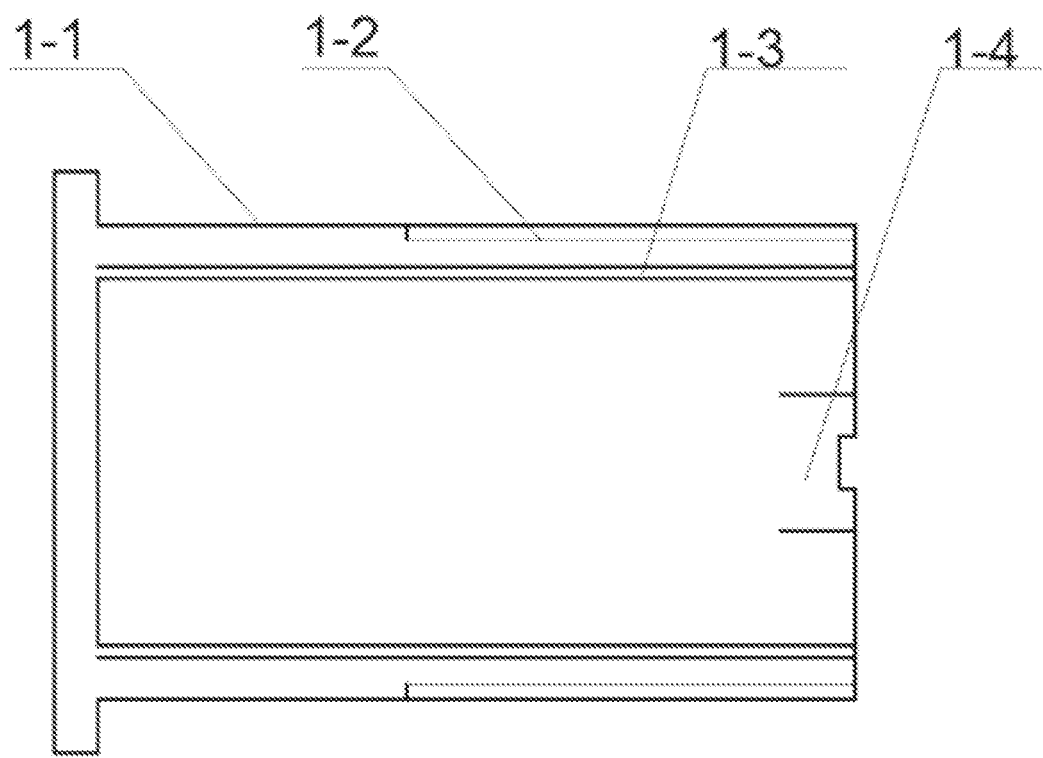
FIG. 3: Schematic diagram of hollow shaft structure.
Figure 4:
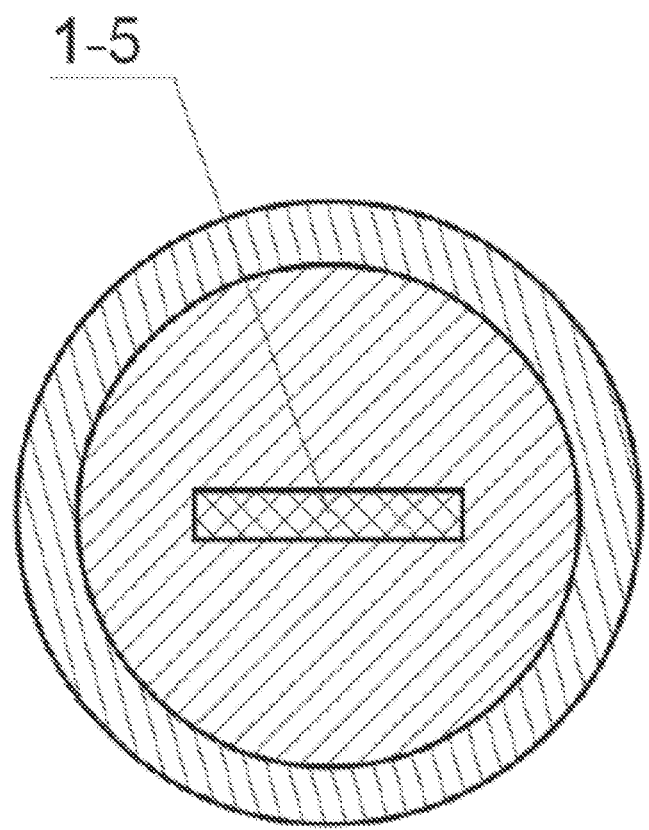
FIG. 4: Schematic diagram of hollow shaft bottom structure.
Figure 5:
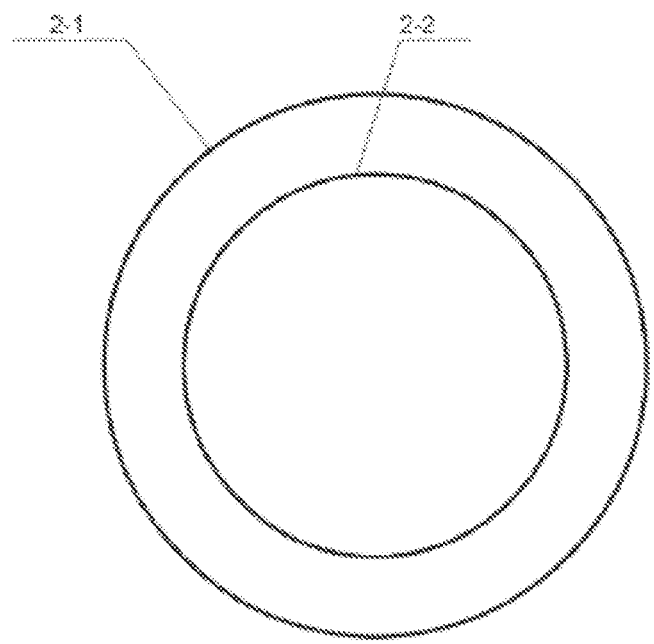
FIG. 5: Schematic diagram of Ultrasonic motor structure.
Figure 6:
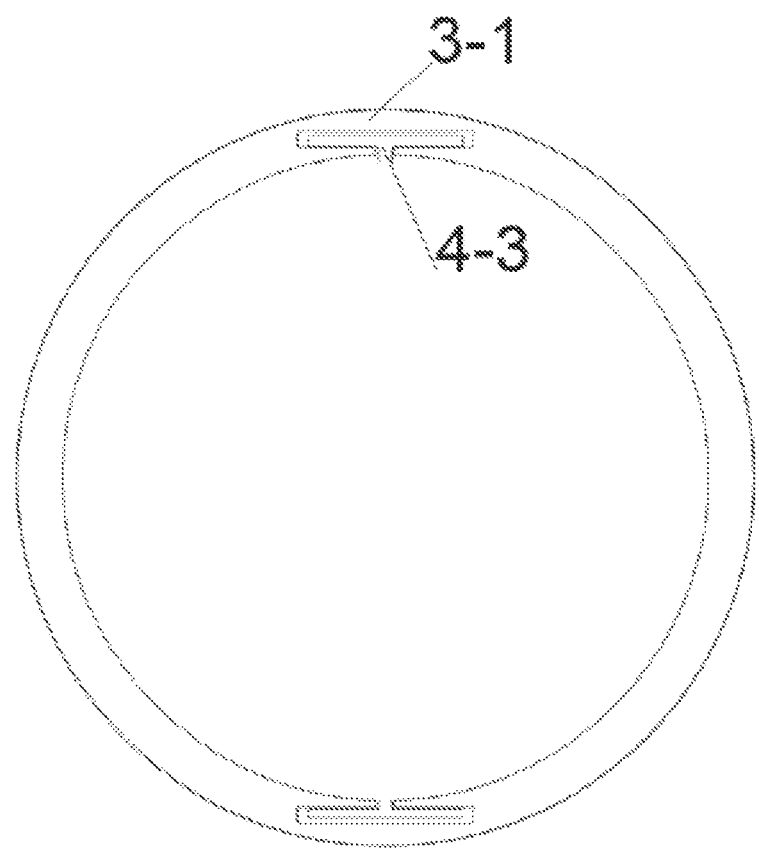
FIG. 6: Schematic diagram of limit chute and slider installation structure.
Figure 7:
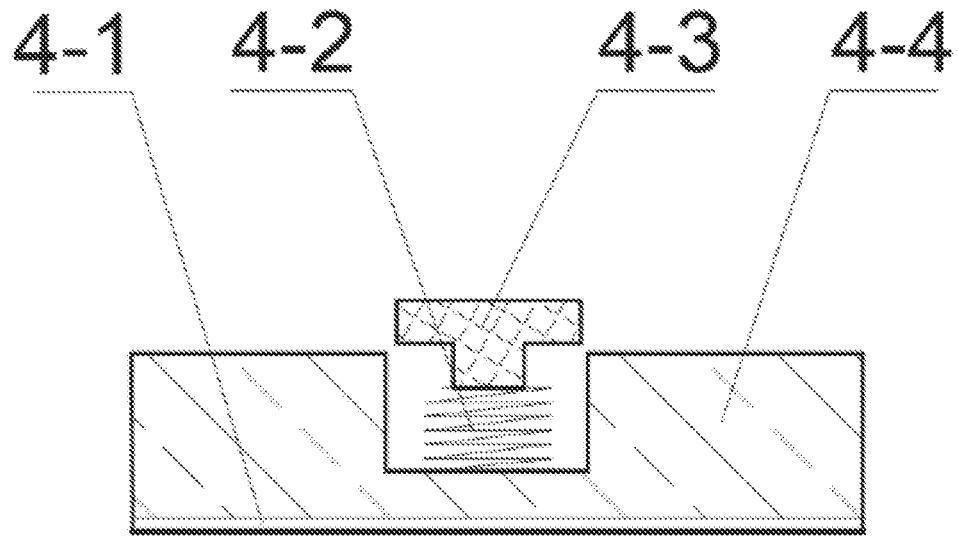
FIG. 7: Schematic diagram of strip spring threaded slider structure.
Figure 8:
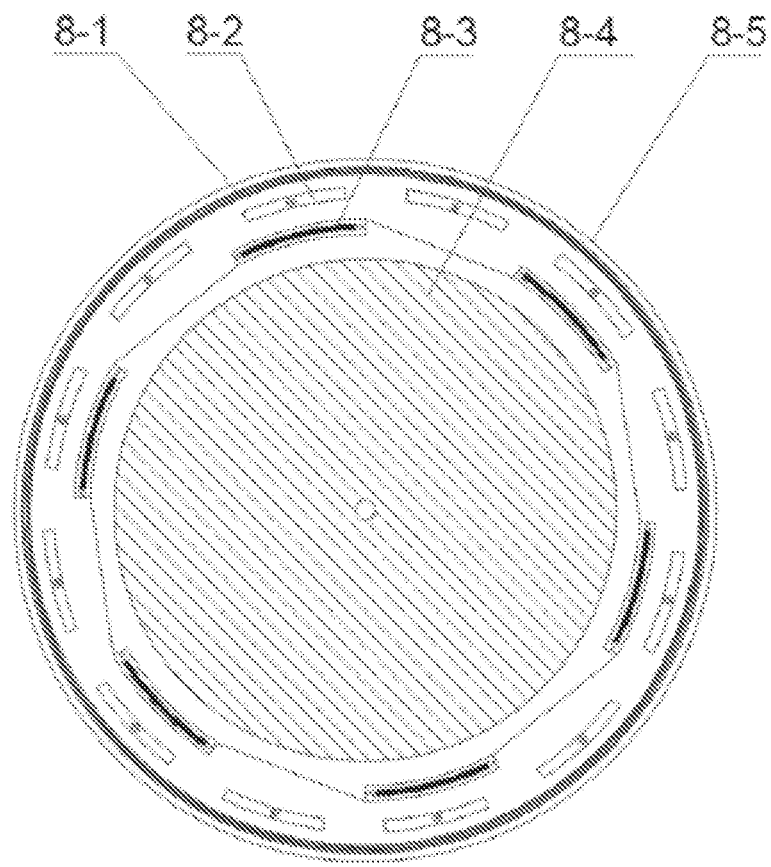
FIG. 8: Schematic diagram of vibration source structure.
Figure 9:
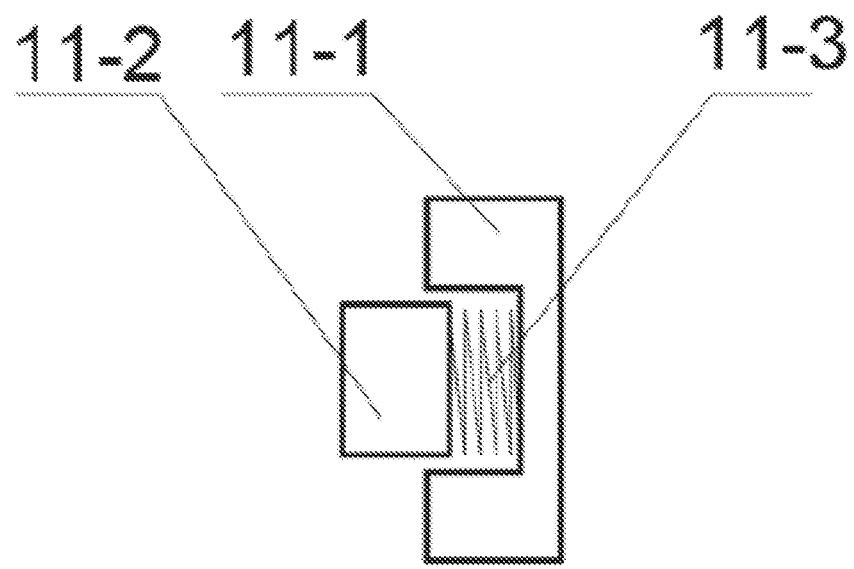
FIG. 9: Front view of pie spring buckle.
Figure 10:
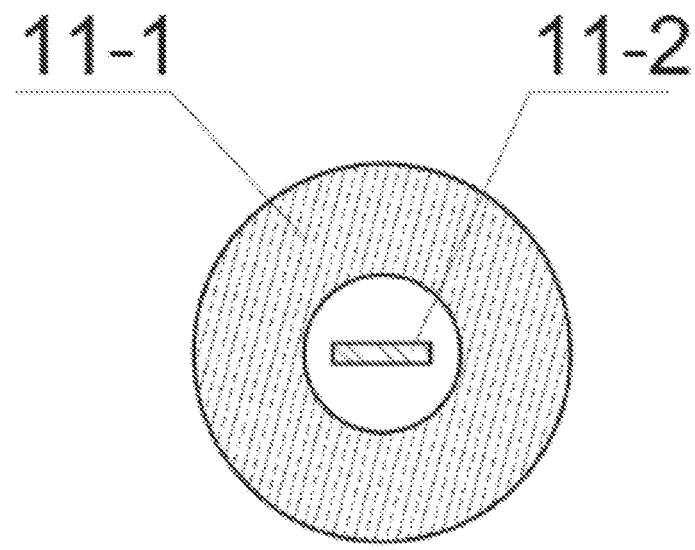
FIG. 10: End view of pie spring buckle.
Figure 11:
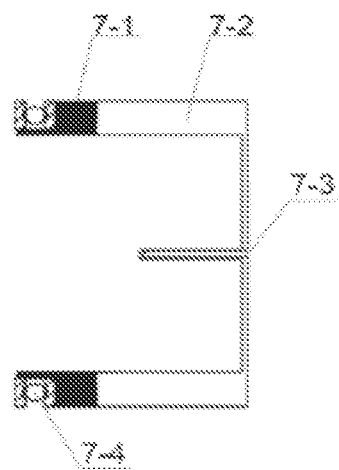
FIG. 11: Schematic diagram of moving tool head structure.

1—Hollow shaft; 2—Ultrasonic motor; 3—Limiting shell; 4—Strip spring threaded slider; 5—Heat insulation ring; 6—Electromagnet; 7—Moving tool head; 8—Vibration source; 9—Tool head; 10—Pie electromagnet; 11—Pie spring buckle; 12—Filler; 1-1 Shell; 1-2 Casing thread; 1-3 Interlayer; 1-4 Reserved groove; 1-5 Groove; 2-1 Ultrasonic motor shell; 2-2 Ultrasonic motor rotor; 3-1 Limiting chute; 4-1 Thread; 4-2 Spring; 4-3 Slider; 4-4 Transmission block; 7-1 Permanent magnet; 7-3 Tool head groove; 7-4 Plane bearing; 8-1 Vibration coil; 8-2 Bias magnet; 8-3 Torsional vibration coil; 8-4 Conduction filler; 8-5 Vibration source shell; 11-1 Pie base; 11-2 Transmission plate; 11-3 Buckle spring.

DETAILED DESCRIPTION OF THE EMBODIMENTS

The embodiments of the present invention are then described in detail. Examples of the embodiments are shown in the attached drawings, where the same or similar label from beginning to end represents the same or similar element or element having the same or similar function. The embodiments described below by reference to the appended drawings are exemplary and are intended to interpret the present invention and are not to be understood as limitations to the present invention.

In the description of the present invention, the need to understand is that the term "the center", "vertical", "horizontal", "length", "width", "thickness" and "up", "down", "axis", "radial", "vertical", "level", "inside" and "outside" indicates a location or position relations based on the location or position shown in the appended drawings, for the purpose of facilitating the description and simplifying the description of the present invention and not indicating or implying that the device or element referred to must have a particular orientation and be constructed and operated in a particular orientation, therefore, it cannot be understood as a limitation of the present invention. Furthermore, the terms "first" and "second" are used only for descriptive purposes. Furthermore, the terms "first" and "second" are used only for descriptive purposes and cannot be understood to indicate or imply relative importance or implicitly to indicate the number of technical features indicated. Thus, a feature that qualifies as "first" or "second" may explicitly or implicitly include one or more of these features. In the description of the present invention, "multiple" means two or more, unless specifically defined otherwise.

In the present invention, the terms "installed", "connected", "connected", "fixed" and other terms shall be understood in a broad sense, unless otherwise expressly provided and limited, for example, it can be a fixed connection, a detachable connection, or an integrated connection. It can be a mechanical connection or an electrical connection. It can be a direct connection or an indirect connection through an intermediary. It can be an internal connection between two components. For ordinary technicians in the field, the above terms can be understood in the specific meaning of the present invention according to specific circumstances.

The embodiments of the present invention are first described in detail in combination with the appended drawings:

A switchable vibration modal ultrasonic device, characterized in that: there is a hollow shaft (1), ultrasonic motor (2) and limiting shell (3); the ultrasonic motor (2) comprises an ultrasonic motor shell (2-1) and an ultrasonic motor rotor (2-2); interference fit between the shell (1-1) of hollow shaft (1) and the ultrasonic motor rotor (2-2), the limiting shell (3) is welded to the ultrasonic motor shell (2-1), and the limiting shell (3) is arranged on the outside of the shell (2-1); the limiting shell (3) and the ultrasonic motor shell (2-1) are provided with a strip spring threaded slider (4) and a moving tool head (7) of strip spring thread; the strip spring thread slider (4) and the moving tool head (7) are arranged in front and behind opposite positions; the electromagnet (6) is mounted on the inner wall of the shell (1-1). When the electromagnet (6) is energized, thread (4-1) on strip spring thread slider (4) is connected to the casing thread (1-2) on shell (1-1). At the same time, the strip spring threaded slider (4) can slide along the inner side wall of the limiting shell (3) in an axial direction. Strip spring threaded slider (4) push the moving tool head (7) along the outer wall of the shell (1-1), the moving tool head (7) is provided with a tool head (9). Among them, the tool head (9) is an acupuncture needle in the embodiment of the present invention, which enables the device to be used in acupuncture treatment.

Further, the hollow shaft (1) comprises a shell (1-1), and a casing thread (1-2) is arranged on the outer wall of the shell (1-1), an interlayer (1-3) is arranged on the inner wall of the shell (1-1), and an insulating ring (5) is arranged inside the interlayer (1-3); the end of the hollow shaft (1) is a solid structure, and a reserved groove (1-4) is arranged on the solid structure, and a groove (1-5) is arranged inside the reserved groove (1-4).

Further, the moving tool head (7) is provided with an internal vibration source (8), the vibration source (8) is fixed with a pie spring clasp (11); the reserved groove (1-4) is provided with a pie electromagnet (10); when the pie electromagnet (10) is energized, under the action of magnetic force, the pie spring buckle (11) is fitted with the pie electromagnet (10). Thus, the vibration source (8) and the moving tool head (7) and the tool head (9) are rotated.

Further, the moving tool head (7) comprises a permanent magnet (7-1), a tool head groove (7-3) and a plane bearing (7-4), the moving tool head (7) is a cylindrical shape, and one end of the cylindrical shape is successively arranged with a plane bearing (7-4) and a permanent magnet (7-1). The bottom of the cylinder is provided with a tool head groove (7-3), tool head groove (7-3) is provided with tool head (9).

Further, the vibration source (8) comprises a vibration coil (8-1), a bias magnet (8-2), a torsional vibration coil (8-3), a conductive filler (8-4) and a vibration source housing (8-5); the vibration source shell (8-5) is successively arranged with a vibration coil (8-1), a paranoid magnet (8-2), a torsional vibration coil (8-3) and a conductive filler (8-4).

Further, the vibration source (8) is centered through a tool head groove (7-3).

Further, the pie spring buckle (11) comprises a pie base (11-1), a transmission plate (11-2) and a buckle spring (11-3). The pie spring base (11-1) is provided with a groove, in which one end of the buckle spring (11-3) is arranged, and the other end of the buckle spring (11-3) is arranged on the transmission plate (11-2).

Further, the slider (4) of the strip spring thread comprises a thread (4-1), a spring (4-2), a slider (4-3) and a transmission block (4-4); the transmission block (4-4) is provided with thread (4-1). Transmission block (4-4) and thread (4-1) are provided with grooves in the vertical direction, one end of a spring (4-2) mounted in the groove, the other end of the spring (4-2) is provided with a slider (4-3); the slider (4-3) is a T-shaped slider.

Further, the limiting shell (3) is provided with a T-type chute along the axial direction, and the T-type chute is sliding connected with the sliding (4-3).

The detection method of a switchable vibration modal ultrasonic device includes the following modes:

Linear motion form: When the electromagnet (6) is energized, the attraction generated by the electromagnet (6) will attract the transmission block (4-4), the thread (4-1) on the transmission block (4-4) is connected to the thread (1-2) on the outer shell of the hollow shaft (1), the slider (4-3) moves in a straight line in the limiting chute (3-1); at the same time, under the action of a permanent magnet (7-1), the transmission block (4-4) is always in contact with the plane bearing (7-4), that is, the tool head (9) is always connected with the transmission block (4-4); the transmission block (4-4) pushes and pulls the moving tool head (7) so that the moving tool head (7) moves in a straight line between the inner wall of the limiting shell (3) and the outer wall of the hollow shaft (1); changing the rotation direction of the ultrasonic motor (2) can change the linear motion direction of the moving tool head (7), that is, forward and backward;

Rotational motion: When the pie electromagnet (10) is not energized, the transmission plate (11-2) of the pie spring buckle (11) is kept away from the groove (1-5) of the hollow shaft (1) under the pull of the buckle spring (11-3), the attraction generated by the pie electromagnet (10) after electrification will attract the transmission plate (11-2) into the groove (1-5) at the bottom of the hollow shaft (1), the moving tool head (7) rotate along the hollow shaft (1); changing the rotation direction of the ultrasonic motor (2) can change the rotation direction of the moving tool head (7), namely the homeopathic needle rotation and counterclockwise rotation;

Vibration form of ultrasonic source: the direction of the bias magnet (8-2) in the vibration source (8) is along the axial direction of the tool head (9), when only the longitudinal vibration coil (8-1) is supplied with alternating current, the direction of the alternating magnetic field generated by the longitudinal vibration coil (8-1) is parallel to the axial direction of the tool head (9). an alternating magnetic field interacts with a bias magnet (8-2), causes longitudinal vibration of tool head (9); when only the torsional vibration coil (8-3) is fed into the AC current, the direction of alternating magnetic field generated by torsional vibration coil (8-3) is the circumferential direction of tool head (9), an alternating magnetic field interacts with a bias magnet (8-2), causes torsional vibration of tool head (9); when the longitudinal vibration coil (8-1), when the torsional vibration coil (8-3) is simultaneously connected to the AC current, causes the tool head (9) to produce a longitudinally torsional vibration mode.

Combined with the attached drawings, an ultrasonic device with a switchable vibration mode includes a hollow shaft (1), ultrasonic motor (2), limiting shell (3), strip spring threaded slider (4), heat insulation ring (5), electromagnet (6), moving tool head (7), Vibration source (8), tool head (9), pie electromagnet (10), pie spring buckle (11) and filler (12);

The hollow shaft (1) consists of shell (1-1), casing thread (1-2), interlayer (1-3) and reserved groove (1-4). The rotating motion of ultrasonic motor (2) is converted into linear motion by fit with strip spring thread slider (4) with casing thread (1-2). The groove (1-5) at the bottom is matched with pie spring buckle (11) to output rotating motion;

The outer wall of the ultrasonic motor (2) is the ultrasonic motor shell (2-1) of the ultrasonic motor, and the inner wall is ultrasonic motor rotor (2-2) of the ultrasonic motor;

The limiting shell (3) is welded on one end of the ultrasonic motor shell (2-1), and the internal limiting shell (3-1) is T-shaped structure, and the slider (4-3) can move in a straight line along the limiting chute (3-1);

The strip spring thread slider (4) includes spring (4-2), slider (4-3) and transmission block (4-4), and the transmission block (4-4) has thread (4-1), which is compatible with the casing thread (1-2) set outside the hollow shaft (1);

The heat insulation ring 5 shall be made of a magnetic conducting material;

Electromagnet (6) generates a magnetic field after switching on the current, which can be used for transmission block (4) under the yoke constraint, and the electromagnet (6) is fitted with the heat insulation ring (5) to reduce heat transfer, electromagnet (6) generates a magnetic field to attract the transmission block (4-4) after switching on the current;

The moving tool head (7) is provided with permanent magnets (7-1) on both sides, a plane bearing (7-4), a tool head groove (7-3) and a rear groove capable of installing a vibration source;

The vibration source (8) comprises a longitudinal vibration coil (8-1), a Bias magnet (8-2), a torsional vibration coil (8-3), a conductive filler (8-4) and a vibration source shell (8-5);

Tool head (9) is made of magnetostrictive material and pre-magnetized along the axis;

The pie electromagnet (10) has a groove in its center;

Pie spring buckle (11) includes pie base (11-1), transmission plate (11-2) and buckle spring (11-3);

The filler (12) can fully fill the hollow part of the hollow shaft (1) to prevent the internal parts from shifting.

In the description of this specification, the reference term "an example", "some embodiments", "examples", "specific examples", or "some examples", etc., refers to the inclusion in at least one embodiment or example of the present invention of a specific feature, structure, material or characteristic described in combination with the embodiment or example. In this specification, a schematic representation of the above terms does not necessarily refer to the same embodiment or example. Furthermore, the specific features, structures, materials or characteristics described may be combined in an appropriate manner in any one or more embodiments or examples.

Notwithstanding that the embodiments of the present invention have been shown and described above, it is understood that the above embodiments are exemplary and cannot be understood as limitations to the present invention, ordinary technicians in the field may change or modify or replace the above embodiments within the scope of the present invention without deviating from the principle and purpose of the present invention.

What is claimed is:

1. A switchable vibration modal ultrasonic device, comprising
a hollow shaft,
an ultrasonic motor and
a limiting shell;
wherein the ultrasonic motor comprises an ultrasonic motor shell and an ultrasonic motor rotor;
interference fit between a shell of the hollow shaft and the ultrasonic motor rotor, the limiting shell is welded to the ultrasonic motor shell, and the limiting shell is arranged on an outside of the ultrasonic motor shell;
the limiting shell and the ultrasonic motor shell are provided with a strip spring threaded slider and a moving tool head of a strip spring thread;
an electromagnet is mounted on an inner wall of the shell of the hollow shaft, wherein when the electromagnet is energized, a thread on the strip spring threaded slider is connected to a casing thread on the shell of the hollow shaft; at the same time, the strip spring threaded slider slides along an inner side wall of the limiting shell in an axial direction; and the strip spring threaded slider pushes the moving tool head along an outer wall of the shell of the hollow shaft; and
the moving tool head is provided with a tool head.

2. The switchable vibration modal ultrasonic device according to claim 1, wherein the hollow shaft comprises the shell of the hollow shaft, and the casing thread is arranged on the outer wall of the shell of the hollow shaft,
wherein an interlayer is arranged on the inner wall of the shell of the hollow shaft, and an insulating ring is arranged inside the interlayer;
an end of the hollow shaft is a solid structure, and a reserved groove is arranged on the solid structure, and a groove is arranged inside the reserved groove.

3. The switchable vibration modal ultrasonic device according to claim 2, wherein the moving tool head is provided with an internal vibration source,
wherein the internal vibration source is fixed with a pie spring buckle; the reserved groove is provided with a pie electromagnet;
when the pie electromagnet is energized, under an action of magnetic force, a pie spring buckle is fitted with the pie electromagnet, and the internal vibration source, the moving tool head and the tool head are rotated.

4. The switchable vibration modal ultrasonic device according to claim 3, wherein the internal vibration source comprises a vibration coil, a bias magnet, a torsional vibration coil, a conductive filler and a vibration source housing;
wherein the vibration source housing is successively arranged with the vibration coil, the bias magnet, the torsional vibration coil and the conductive filler.

5. The switchable vibration modal ultrasonic device according to claim 3, wherein the internal vibration source is centered through a tool head groove.

6. The switchable vibration modal ultrasonic device according to claim 3, wherein the pie spring buckle comprises a pie base, a transmission plate and a buckle spring;
wherein the pie base is provided with a groove, in which a first end of the buckle spring is arranged, and a second end of the buckle spring is arranged on the transmission plate.

7. The switchable vibration modal ultrasonic device according to claim 1, wherein the moving tool head comprises a permanent magnet, a tool head groove and a plane bearing;
wherein the moving tool head is a cylindrical shape, and one end of the cylindrical shape is successively arranged with the plane bearing and the permanent magnet; a bottom of the cylindrical shape is provided with the tool head groove, and the tool head groove is provided with the tool head.

8. The switchable vibration modal ultrasonic device according to claim 1, wherein the strip spring threaded slider comprises a thread, a spring, a slider and a transmission block;
wherein the transmission block is provided with the thread;
the transmission block and the thread are provided with grooves in a vertical direction, wherein a first end of the spring is mounted in the grooves, and a second end of the spring is provided with the slider; and the slider is a T-shaped slider.

9. The switchable vibration modal ultrasonic device according to claim 8, wherein the limiting shell is provided with a T-type chute along the axial direction, and the T-type chute is slidingly connected with the slider.

10. A detection method based on the switchable vibration modal ultrasonic device according to claim 1, comprising the following modes:
1) a linear motion form:
when the electromagnet is energized, an attraction generated by the electromagnet attracts a transmission block, a thread on the transmission block is connected to the casing thread on the shell of the hollow shaft, the strip spring threaded slider moves in a straight line in a limiting chute;
at the same time, under an action of a permanent magnet, the transmission block is always in contact with a plane bearing, and the tool head is always connected with the transmission block; the transmission block pushes and pulls the moving tool head in a straight line between the inner side wall of the limiting shell and the outer wall of the shell of the hollow shaft; changing a rotation direction of the ultrasonic motor changes a linear motion direction of the moving tool head, wherein the linear motion of the moving tool head is forward and backward;
2) a rotational motion:
when a pie electromagnet is not energized, a transmission plate of a pie spring buckle is kept away from a groove of the hollow shaft under a pull of a buckle spring, an attraction generated by the pie electromagnet after electrification will attract the transmission plate into the groove of the hollow shaft at a bottom of the hollow shaft, the moving tool head rotates along the hollow shaft; changing the rotation direction of the ultrasonic motor changes a rotation direction of the moving tool head, wherein the rotation direction of the moving tool head is a homeopathic needle rotation and a counterclockwise rotation;
3) a vibration form of ultrasonic source:
a direction of a bias magnet in an internal vibration source is along an axial direction of the tool head, when only a longitudinal vibration coil is supplied with an alternating current, a direction of an alternating magnetic field generated by the longitudinal vibration coil is parallel to the axial direction of the tool head; the alternating magnetic field interacts with the bias magnet, causes longitudinal vibration of the tool head;
when only a torsional vibration coil is fed into the alternating current, a direction of an alternating magnetic field generated by the torsional vibration coil is a circumferential direction of the tool head, the alternating magnetic field interacts with the bias magnet and causes torsional vibration of the tool head; when the longitudinal vibration coil, when the torsional vibration coil is simultaneously connected to the alternating current, causes the tool head to produce a longitudinally torsional vibration mode.

11. The detection method based on the switchable vibration modal ultrasonic device according to claim 10, wherein the hollow shaft comprises the shell of the hollow shaft, and the casing thread is arranged on the outer wall of the shell of the hollow shaft,
wherein an interlayer is arranged on the inner wall of the shell of the hollow shaft, and an insulating ring is arranged inside the interlayer;
an end of the hollow shaft is a solid structure, and a reserved groove is arranged on the solid structure, and a groove is arranged inside the reserved groove.

12. The detection method based on the switchable vibration modal ultrasonic device according to claim 11, wherein the moving tool head is provided with the internal vibration source,
wherein the internal vibration source is fixed with the pie spring buckle; the reserved groove is provided with the pie electromagnet;
when the pie electromagnet is energized, under an action of magnetic force, the pie spring buckle is fitted with the pie electromagnet, and the internal vibration source, the moving tool head and the tool head are rotated.

13. The detection method based on the switchable vibration modal ultrasonic device according to claim 12, wherein the internal vibration source comprises a vibration coil, the bias magnet, the torsional vibration coil, a conductive filler and a vibration source housing;
wherein the vibration source housing is successively arranged with the vibration coil, the bias magnet, the torsional vibration coil and the conductive filler.

14. The detection method based on the switchable vibration modal ultrasonic device according to claim 12, wherein the internal vibration source is centered through a tool head groove.

15. The detection method based on the switchable vibration modal ultrasonic device according to claim 12, wherein the pie spring buckle comprises a pie base, a transmission plate and a buckle spring;
wherein the pie base is provided with a groove, in which a first end of the buckle spring is arranged, and a second end of the buckle spring is arranged on the transmission plate.

16. The detection method based on the switchable vibration modal ultrasonic device according to claim 10, wherein the moving tool head comprises a permanent magnet, a tool head groove and a plane bearing;
wherein the moving tool head is a cylindrical shape, and one end of the cylindrical shape is successively arranged with the plane bearing and the permanent magnet; a bottom of the cylindrical shape is provided with the tool head groove, and the tool head groove is provided with the tool head.

17. The detection method based on the switchable vibration modal ultrasonic device according to claim 10, wherein the strip spring threaded slider comprises a thread, a spring, a slider and a transmission block;
wherein the transmission block is provided with the thread;
the transmission block and the thread are provided with grooves in a vertical direction, wherein a first end of the spring is mounted in the grooves, and a second end of the spring is provided with the slider; and the slider is a T-shaped slider.

18. The detection method based on the switchable vibration modal ultrasonic device according to claim 17, wherein the limiting shell is provided with a T-type chute along the axial direction, and the T-type chute is slidingly connected with the slider.

\* \* \* \* \*